(12) United States Patent
Nakamura et al.

(10) Patent No.: US 11,183,608 B2
(45) Date of Patent: Nov. 23, 2021

(54) PHOTODETECTING DEVICE WITH WEAK LIGHT SIGNAL DETECTION AND LOW POWER CONSUMPTION

(71) Applicant: HAMAMATSU PHOTONICS K.K., Hamamatsu (JP)

(72) Inventors: Shigeyuki Nakamura, Hamamatsu (JP); Shunsuke Adachi, Hamamatsu (JP); Takashi Baba, Hamamatsu (JP); Terumasa Nagano, Hamamatsu (JP); Koei Yamamoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/348,187

(22) PCT Filed: Nov. 9, 2017

(86) PCT No.: PCT/JP2017/040438
§ 371 (c)(1),
(2) Date: May 8, 2019

(87) PCT Pub. No.: WO2018/088478
PCT Pub. Date: May 17, 2018

(65) Prior Publication Data
US 2019/0334050 A1 Oct. 31, 2019

(30) Foreign Application Priority Data
Nov. 11, 2016 (JP) .............................. JP2016-220781

(51) Int. Cl.
*H01L 31/101* (2006.01)
*H01L 27/146* (2006.01)
(Continued)

(52) U.S. Cl.
CPC .......... *H01L 31/101* (2013.01); *H01L 27/146* (2013.01); *H01L 31/02* (2013.01); *H01L 31/0256* (2013.01); *H04N 5/378* (2013.01)

(58) Field of Classification Search
CPC ... H01L 27/14636; H01L 31/107–1075; H01L 27/146; H01L 31/022408–022416
See application file for complete search history.

(56) References Cited

U.S. PATENT DOCUMENTS

2013/0153975 A1* 6/2013 Henseler ............. H01L 27/1443
257/290
2013/0235240 A1* 9/2013 Yoshida ............... H04N 5/3745
348/302
(Continued)

FOREIGN PATENT DOCUMENTS

JP 2005-265607 A 9/2005
JP 2006-332796 A 12/2006
(Continued)

OTHER PUBLICATIONS

International Preliminary Report on Patentability dated May 23, 2019 for PCT/JP2017/040438.

*Primary Examiner* — Wasiul Haider
(74) *Attorney, Agent, or Firm* — Faegre Drinker Biddle & Reath LLP

(57) ABSTRACT

A photodetecting device includes a semiconductor photodetecting element including a plurality of pixels distributed two-dimensionally and a mount substrate including a plurality of signal processing units arranged to process output signals from the corresponding pixels. The semiconductor photodetecting element includes, for each of the pixels, a plurality of avalanche photodiodes arranged to operate in Geiger mode, a plurality of quenching resistors each electrically connected in series with a respective avalanche photodiodes, and a through-electrode electrically connected (Continued)

to the plurality of quenching resistors. Each of the signal processing units includes a current mirror circuit electrically connected to the plurality of avalanche photodiodes via the corresponding through-electrode and arranged to output a signal corresponding to output signals from the plurality of avalanche photodiodes. The number of signal processing units included on the mount substrate is more than the number of light receiving regions in each of the pixels.

4 Claims, 9 Drawing Sheets

(51) Int. Cl.
  *H01L 31/02* (2006.01)
  *H01L 31/0256* (2006.01)
  *H04N 5/378* (2011.01)

(56) References Cited

U.S. PATENT DOCUMENTS

| | | | |
|---|---|---|---|
| 2014/0263975 A1* | 9/2014 | Nagano | H01L 28/20 250/208.2 |
| 2015/0108358 A1* | 4/2015 | Sasaki | G01T 1/2002 250/370.11 |
| 2016/0329455 A1 | 11/2016 | Nagano et al. | |
| 2018/0226930 A1* | 8/2018 | Schober | H03F 3/45475 |
| 2019/0204461 A1* | 7/2019 | Lerche | H01L 27/14663 |

FOREIGN PATENT DOCUMENTS

| | | |
|---|---|---|
| JP | 2013-16638 A | 1/2013 |
| JP | 2013-89917 A | 5/2013 |
| JP | 2013-89918 A | 5/2013 |
| JP | 2013-187704 A | 9/2013 |
| JP | 2016-154259 A | 8/2016 |
| JP | 2016-174048 A | 9/2016 |
| JP | 2016-174129 A | 9/2016 |

* cited by examiner

PHOTODETECTING DEVICE WITH WEAK LIGHT SIGNAL DETECTION AND LOW POWER CONSUMPTION

TECHNICAL FIELD

The present invention relates to a photodetecting device.

BACKGROUND ART

Known photodetecting devices include a plurality of two-dimensionally distributed pixels and a plurality of signal processing units arranged to process output signals from respective pixels (for example, see Patent Literature 1 and 2). Each pixel includes a photodiode.

CITATION LIST

Patent Literature

Patent Literature 1: Japanese Unexamined Patent Publication No. 2005-265607
Patent Literature 2: Japanese Unexamined Patent Publication No. 2006-332796

SUMMARY OF INVENTION

Technical Problem

In photodetecting devices described in Patent Literatures 1 and 2, the photosensitivity of each pixel is low, and therefore, imaging of weak light (for example, a single photon) is difficult. When a light-receiving area of a pixel is large, a photosensitivity of the pixel is ensured, as compared with when a light-receiving area of a pixel is small. However, when the light-receiving area of the pixel is large, the following problems may occur. Since it is difficult to reduce a pitch between the pixels, a sufficient resolution cannot be ensured in imaging. Since background light is easy to receive at each pixel, the amount of the background light received is large. When the proportion of the amount of the received background light to the amount of the received weak light of the detection target is large, the background light component tends not to be cut off. Since a PN junction capacitance at the photodiode is large, a response speed from receiving the weak light to outputting a signal is slow.

In the photodetecting device described in Patent Literatures 1 and 2, the signal from the photodiode is amplified by an operational amplifier circuit. However, if the gain of the operational amplifier circuit is increased to detect the weak light, the operational amplifier circuit is forced to decrease the response speed or increase a supply power. If the response speed of the operational amplifier circuit decreases, a steepness of a rise of an input signal may not be accurately transmitted to a circuit in a subsequent stage connected to the operational amplifier circuit. If the supply power to the operational amplifier circuit increases, a power consumption of the entire device becomes enormous.

The object of an aspect of the present invention is to provide a photodetecting device arranged to detect weak light with high accuracy and low power consumption.

Solution to Problem

An aspect of the present invention is a photodetecting device including a semiconductor photodetecting element and a mount substrate on which the semiconductor photodetecting element is mounted. The semiconductor photodetecting element includes a semiconductor substrate having a first principal surface and a second principal surface opposing each other, and a plurality of pixels distributed two-dimensionally in the semiconductor substrate. The mount substrate includes a plurality of signal processing units arranged to process output signals from the respective pixels. For each of the pixels, the semiconductor photodetecting element includes a plurality of avalanche photodiodes arranged to operate in Geiger mode, a plurality of quenching resistors, and a through-electrode penetrating through the semiconductor substrate in a thickness direction. Each of the plurality of avalanche photodiodes includes a light receiving region provided in the first principal surface of the semiconductor substrate. The plurality of quenching resistors are provided on the first principal surface of the semiconductor substrate, and each electrically connected in series with a respective avalanche photodiodes. The through-electrode is electrically connected to the plurality of quenching resistors. The light receiving regions of the plurality of avalanche photodiodes are two-dimensionally distributed for each of the pixels. Each of the signal processing units includes a current mirror circuit electrically connected to the plurality of avalanche photodiodes via the corresponding through-electrode. The current mirror circuit is arranged to output a signal corresponding to output signals from the plurality of avalanche photodiodes. The number of signal processing units included on the mount substrate is more than the number of light receiving regions in each of the pixels.

In the photodetecting device according to the aspect, the semiconductor photodetecting element includes the plurality of avalanche photodiodes arranged to operate in Geiger mode for each of the two-dimensionally distributed pixels. The number of signal processing units included on the mount substrate is more than the number of light receiving regions in each of the pixels. In the photodetecting device according to the aspect, the internal multiplication function of each avalanche photodiode improves the photosensitivity at each pixel, as compared with photodetecting devices using generally-available photodiodes. Therefore, even when the light-receiving area of each pixel is reduced in order to improve the resolution in imaging, the photodetecting device according to the aspect detects weak light which is difficult to detect with the photodetecting devices using generally-available photodiodes.

Background light is noise for weak light. The proportion of the amount of the background light received to the amount of the weak light received is small when the light-receiving area of each pixel is small, as compared with when the light-receiving area of each pixel is large. Therefore, the background light component per pixel is small. When the light-receiving area of each pixel is small, the sum of the PN junction capacitances of the avalanche photodiodes in each pixel is also small. Therefore, an output signal with a steep rise is obtained from each avalanche photodiode.

In the photodetecting device according to the aspect, each signal processing unit includes the current mirror circuit. The current mirror circuit consumes low power consumption and has a higher response speed than an operational amplifier circuit, and transmits information about the input signal accurately. The information about the input signal includes, for example, signal waveform. Therefore, the current mirror circuit accurately transmits a steepness of a rise of the output signal from each avalanche photodiode. As a result, the photodetecting device according to the aspect detects weak light with a high degree of accuracy and with low power consumption.

In the photodetecting device according to the aspect, each signal processing unit may include a gate grounded circuit, and the current mirror circuit may be each arranged to receive an output signal from the gate grounded circuit. In which case, the gate grounded circuit is provided between the corresponding through-electrode and the current mirror circuit, and the gate grounded circuit is arranged to receive the output signals from the plurality of avalanche photodiodes via the corresponding through-electrode. The input impedance of the gate grounded circuit is lower than the input impedance of the read circuits other than the gate grounded circuit. Therefore, the gate grounded circuit accurately transmits the steepness of the rise of the output signal from each avalanche photodiode. As a result, in this embodiment, each signal processing unit more accurately transmits the steepness of the rise of the output signal from each avalanche photodiode.

In the photodetecting device according to the aspect, each signal processing unit may include a comparator arranged to receive an output signal from the current mirror circuit. In which case, a signal having a desired pulse wave height is obtained from the signals input into the comparator.

Advantageous Effects of Invention

An aspect of the present invention provides a photodetecting device arranged to detect weak light with high accuracy and low power consumption.

DESCRIPTION OF EMBODIMENTS

Figure 1:
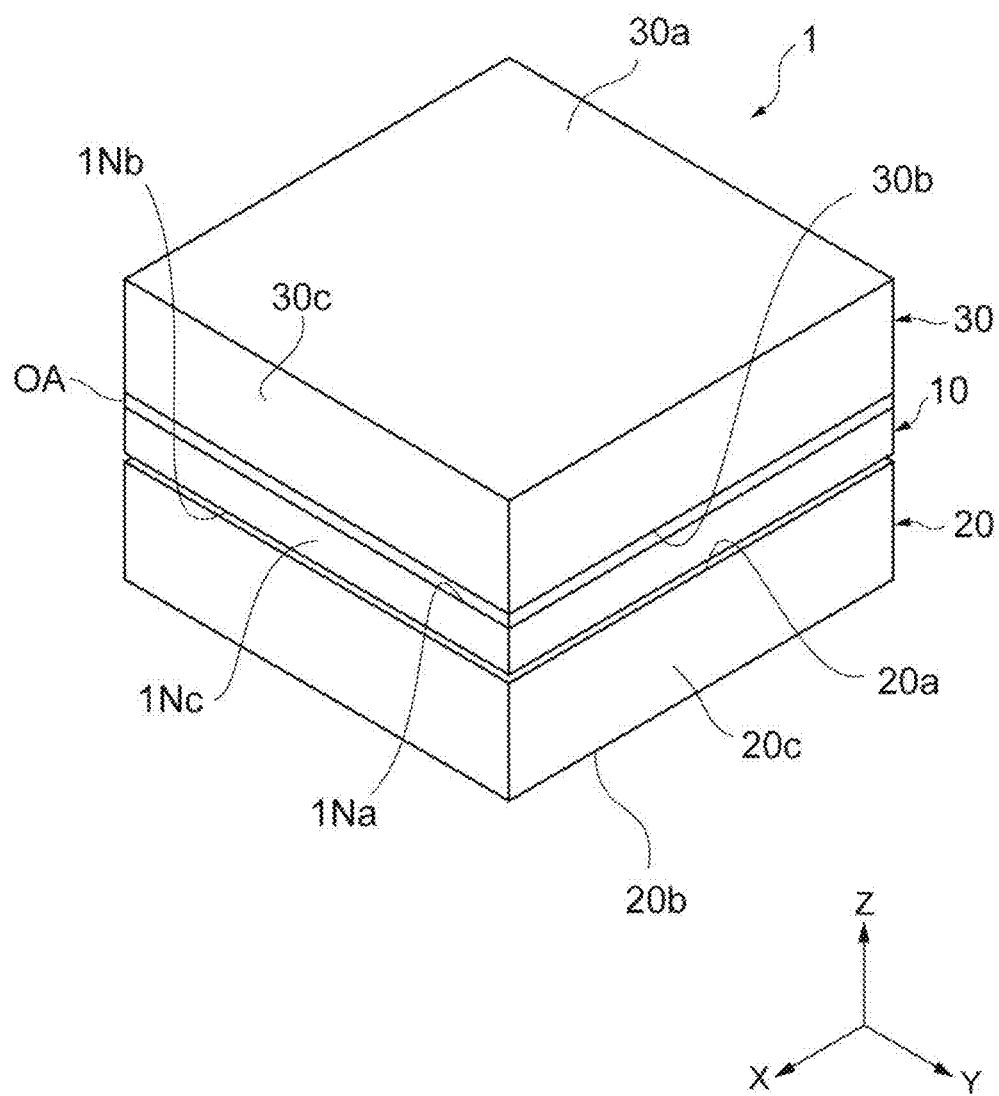
FIG. 1 is a schematic perspective view illustrating a photodetecting device according to one embodiment.

Embodiments of the present invention will be hereinafter described in detail with reference to the accompanying drawings. In the description, the same reference numerals are used for the same elements or elements having the same functions, and redundant descriptions thereabout are omitted.

Figure 2:
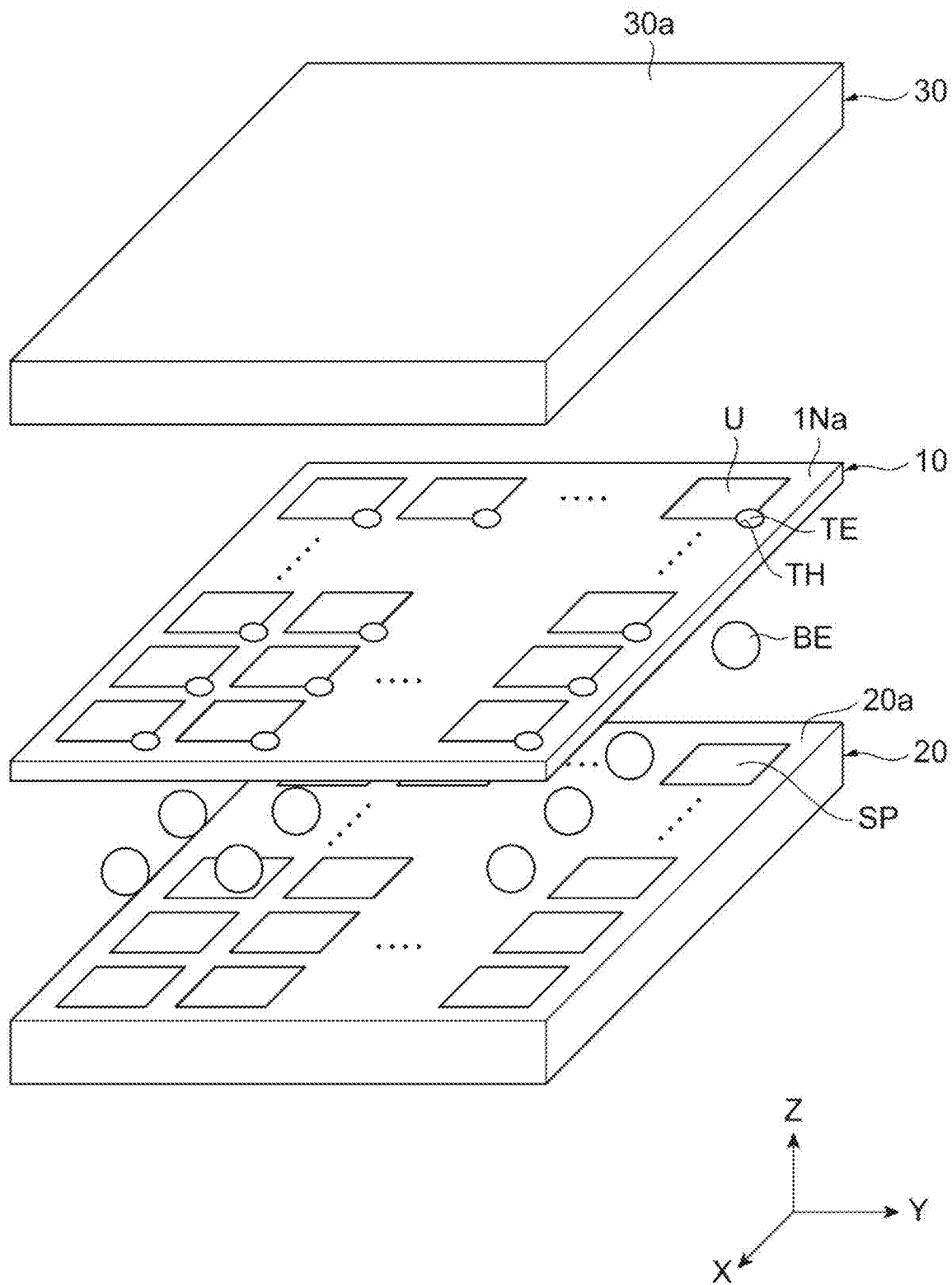
FIG. 2 is an exploded perspective view of the photodetecting device.

First, a configuration of a photodetecting device according to the present embodiment will be described with reference to FIG. 1 and FIG. 2. FIG. 1 is a schematic perspective view illustrating a photodetecting device according to the present embodiment. FIG. 2 is an exploded perspective view of the photodetecting device illustrated in FIG. 1.

As illustrated in FIG. 1 and FIG. 2, the photodetecting device 1 includes a semiconductor photodetecting element 10, a mount substrate 20, and a glass substrate 30. The mount substrate 20 opposes the semiconductor photodetecting element 10. The glass substrate 30 opposes the semiconductor photodetecting element 10. The semiconductor photodetecting element 10 is disposed between the mount substrate 20 and the glass substrate 30. In the present embodiment, a plane in parallel with each principal surface of the semiconductor photodetecting element 10, the mount substrate 20, and the glass substrate 30 is XY-axis plane, and a direction perpendicular to each principal surface is Z-axis direction.

The semiconductor photodetecting element 10 includes a semiconductor substrate 50 having a rectangular shape in a plan view. The semiconductor substrate 50 is made of Si and is an N type semiconductor substrate. The semiconductor substrate 50 includes a principal surface 1Na and a principal surface 1Nb that oppose each other. The N type is an example of a first conductivity type. An example of a second conductivity type is a P type.

As illustrated in FIG. 2, the semiconductor photodetecting element 10 includes a plurality of pixels U and a plurality of through-electrodes TE. The plurality of pixels U are two-dimensionally distributed in a matrix in the semiconductor substrate 50. The plurality of through-electrodes TE: are also two-dimensionally distributed in a matrix on the semiconductor substrate 50. The photodetecting device 1 outputs signals corresponding to the light detected in the plurality of pixels U. In the present embodiment, the number of pixels U is "1024 (32×32)". A pitch WU between pixels U is 10 to 500 μm in the row direction and the column direction. The row direction is the X axis direction, and the column direction is the Y axis direction.

The glass substrate 30 includes a principal surface 30a and a principal surface 30b that oppose each other. The glass substrate 30 has a rectangular shape in a plan view. The principal surface 30b opposes the principal surface 1Na of the semiconductor substrate 50. The principal surface 30a and the principal surface 30b are flat. The glass substrate 30 and the semiconductor photodetecting element 10 are optically connected by an optical adhesive OA. The glass substrate 30 may be formed directly on the semiconductor photodetecting element 10A.

The mount substrate 20 includes a principal surface 20a and a principal surface 20b that oppose each other. The mount substrate 20 has a rectangular shape in a plan view. The semiconductor photodetecting element 10 is mounted on the mount substrate 20. The principal surface 20a opposes the principal surface 1Nb.

The mount substrate 20 constitutes an ASIC (Application Specific Integrated Circuit). As illustrated in FIG. 2, the mount substrate 20 includes a plurality of signal processing units SP. The plurality of signal processing units SP are two-dimensionally distributed in the principal surface 20a side of the mount substrate 20. Each signal processing unit SP includes an electrode arranged corresponding to the through-electrode TE. Each electrode is electrically connected to a corresponding through-electrode TE through a bump electrode BE.

The side surfaces 1Nc of the semiconductor substrate 50, the side surfaces 30c of the glass substrate 30, and the side surfaces 20c of the mount substrate 20 are flush with each other. That is, in the plan view, the outer edges of the semiconductor substrate 50, the outer edges of the glass substrate 30, and the outer edges of the mount substrate 20 match each other. The outer edges of the semiconductor substrate 50, the outer edges of the glass substrate 30, and the outer edges of the mount substrate 20 do not have to match each other. For example, in the plan view, the area of the mount substrate 20 may be larger than the area of each of the semiconductor substrate 50A and the glass substrate 30. In which case, the side surfaces 20c of the mount substrate 20 are located outside, in the XY-axis plane direction, of the side surfaces 1Nc of the semiconductor substrate 50 and the side surfaces 30c of the glass substrate 30.

Figure 3:
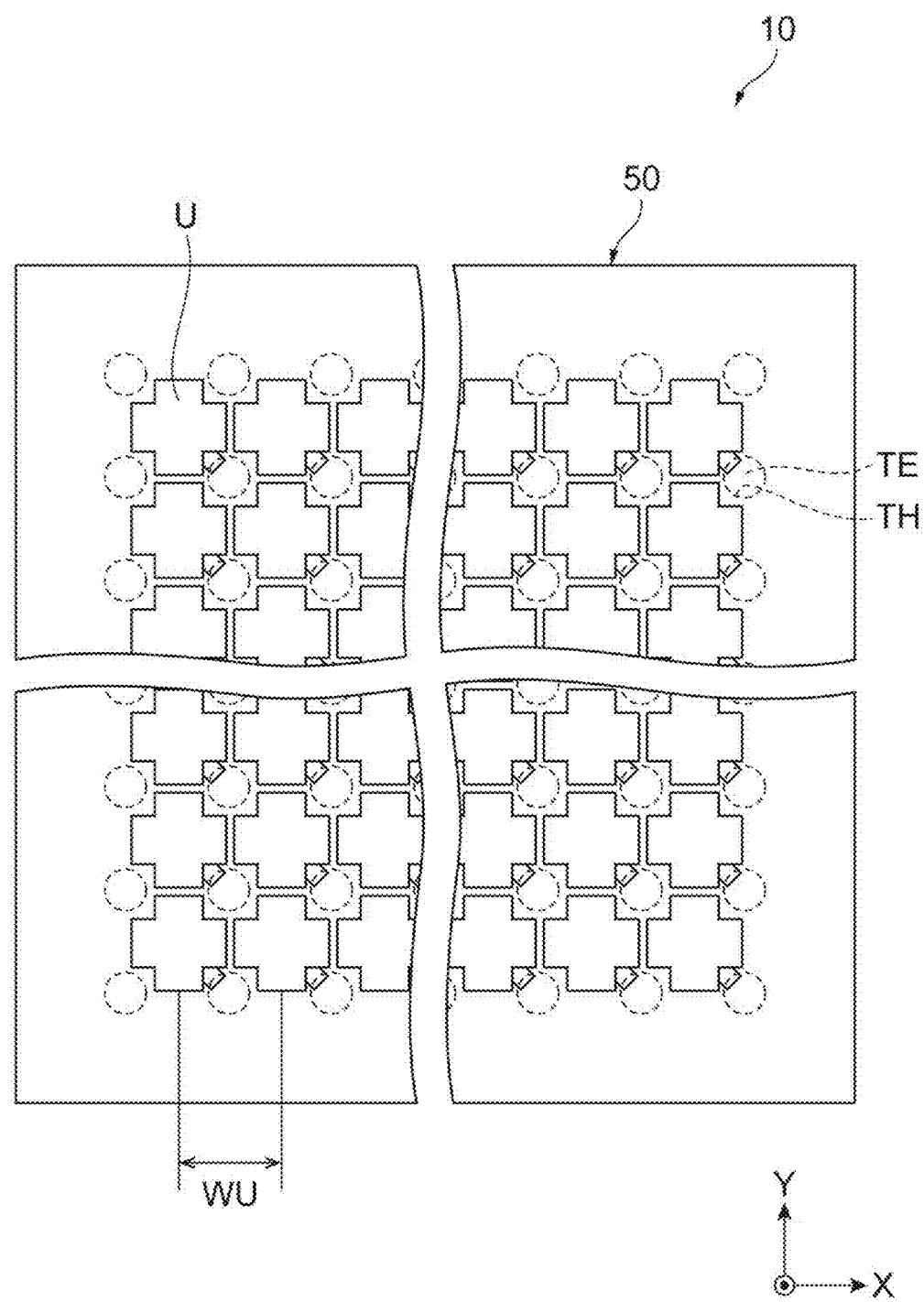
FIG. 3 is a schematic plan view illustrating a semiconductor photodetecting element.
Figure 4:
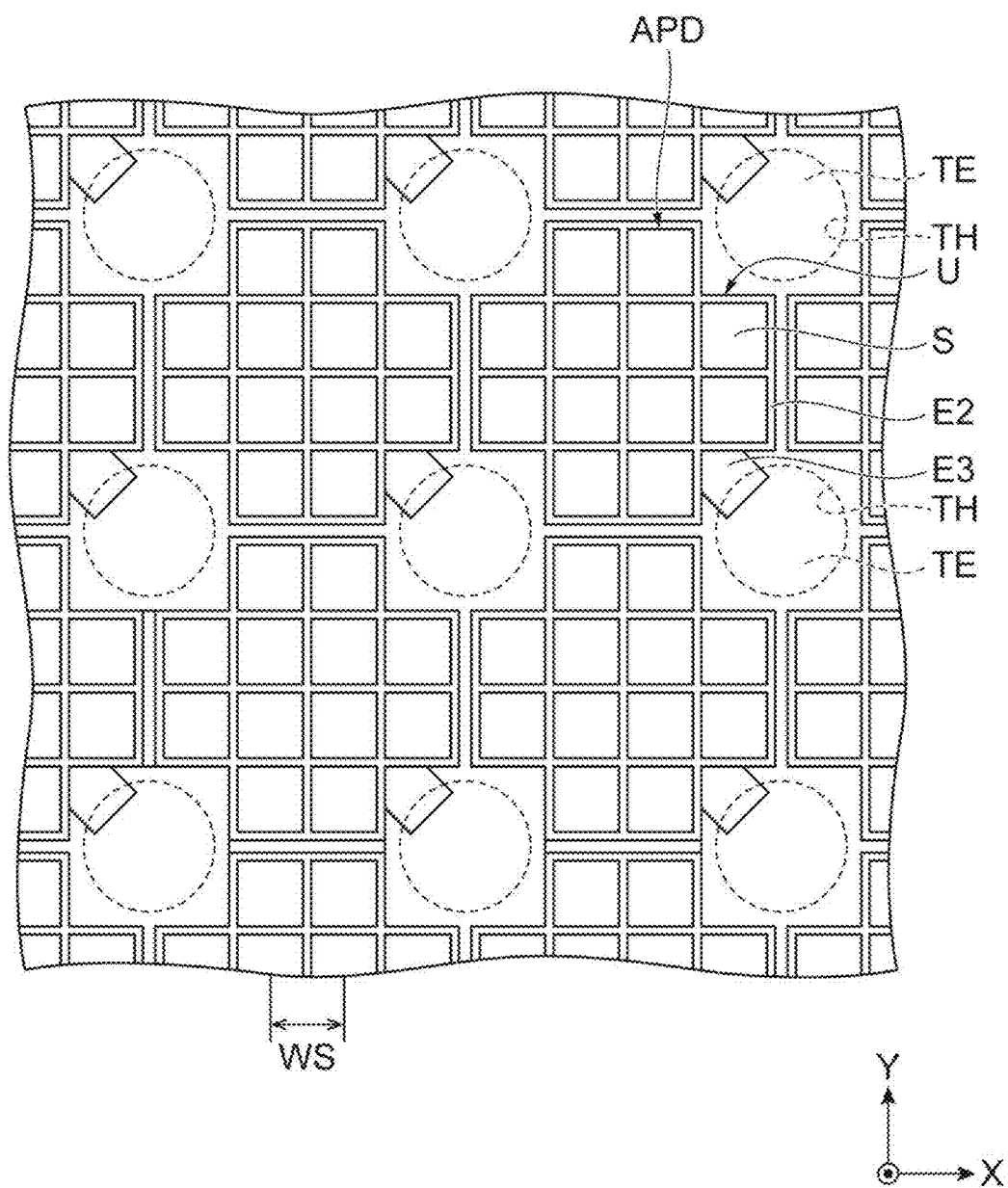
FIG. 4 is a schematic enlarged view illustrating a semiconductor photodetecting element.
Figure 5:
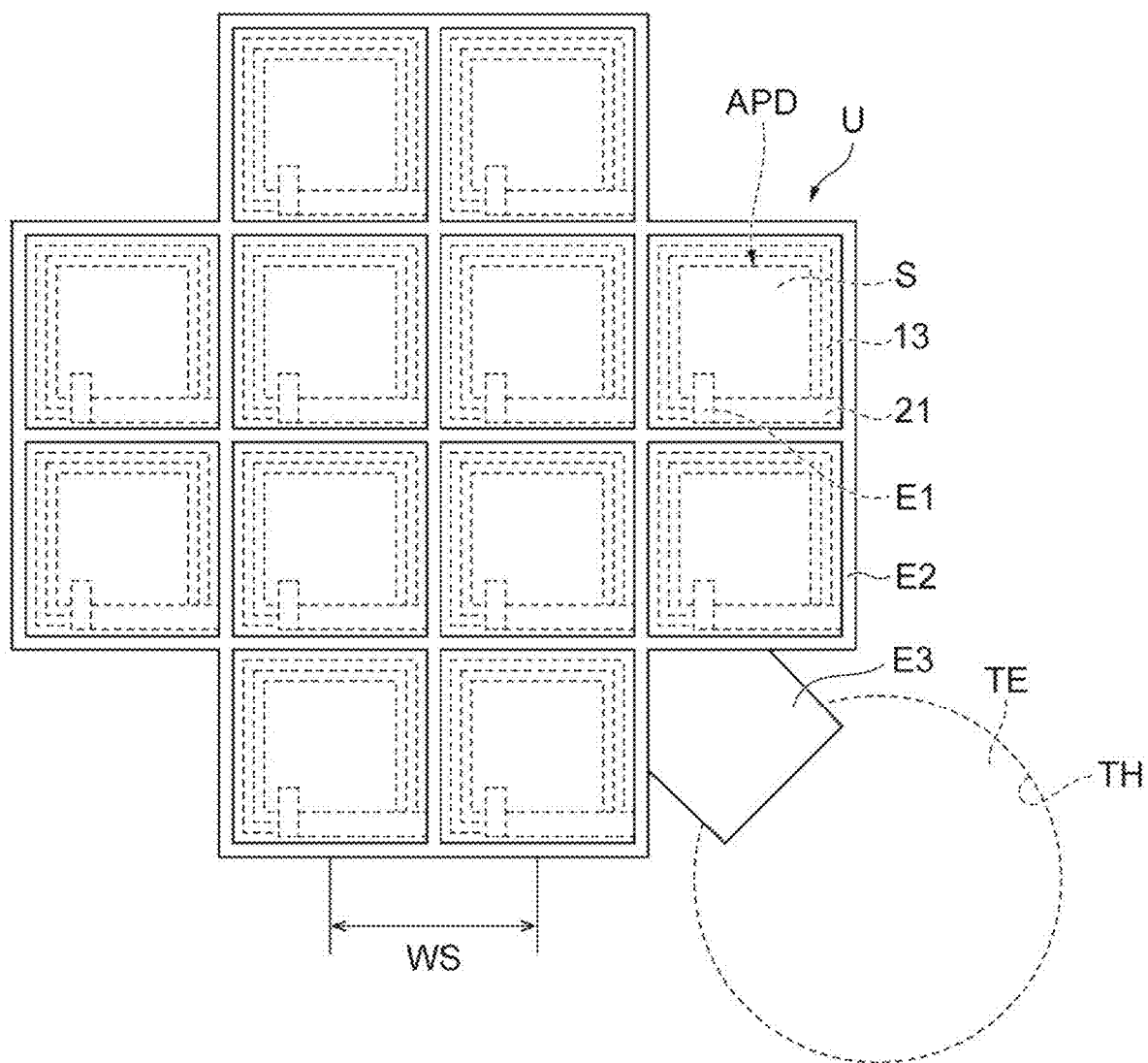
FIG. 5 is a schematic enlarged view illustrating a semiconductor photodetecting element.

Next, a configuration of the semiconductor photodetecting element 10 will be described with reference to FIG. 3 to FIG. 5. FIG. 3 is a view of the semiconductor photodetecting element 10 as seen from the direction (Z axis direction) orthogonal to the principal surface 1Na. In FIG. 3, the insulation layer L4 (see FIG. 6) is not illustrated. FIG. 4 illustrates an area where the pixel U and the through-electrode TE are formed. FIG. 5 illustrates one pixel U and the vicinity of the pixel U.

For every pixel U, the semiconductor photodetecting element 10 includes a plurality of avalanche photodiodes APD arranged to operate in Geiger mode, a plurality of quenching resistors 21, and a through-electrode TE. The through-electrode TE penetrates through the semiconductor substrate 50 in the thickness direction (Z axis direction).

The plurality of avalanche photodiodes APD are two-dimensionally distributed in the semiconductor substrate 50. Each avalanche photodiode APD includes a light receiving region S. The light receiving region S is provided in the principal surface 1Na side of the semiconductor substrate 50. As illustrated in FIG. 4, in the semiconductor photodetecting element 10, each pixel U includes a plurality of light receiving regions S. The plurality of light receiving regions S are two-dimensionally distributed in each pixel U. A pitch WS of the light receiving region S in one pixel U is 10 to 50 μm in the row direction and the column direction. The light receiving region S is a charge generating region (a photosensitive region) configured to generate charges in response to incident light. That is, the light receiving region S1 is a photodetecting region.

As illustrated in FIG. 5, each light receiving region S has a rectangular shape when viewed from the Z axis direction. In the semiconductor substrate 50, a trench 13 is formed to surround the entire circumference of each light receiving region S when viewed from the Z axis direction. Like the light receiving region S, the area surrounded by the trench 13 has a rectangular shape when viewed from the Z axis direction.

For each pixel U, the semiconductor photodetecting element 10 includes a plurality of electrodes E1, an electrode E2, and an electrode E3. Each of the electrodes E1 is connected to a corresponding light receiving region S. The electrodes E1 are each disposed on the principal surface 1Na of the semiconductor substrate 50 and extends outside of a light receiving region S. The electrodes E1 are each connected to a quenching resistor 21. The electrodes E1 each connect a light receiving region S and a quenching resistor 21 that correspond to each other. Each electrode E1 has an end connected to the light receiving region S and an end connected to a quenching resistor 21.

Each of the quenching resistors 21 is arranged on the principal surface 1Na of the semiconductor substrate 50. The quenching resistors 21 each extend along the outer edge of a light receiving region S. Each quenching resistor 21 is electrically connected in series with a light receiving region S of a corresponding avalanche photodiode APD through an electrode E1. The quenching resistors 21 each constitute a passive quenching circuit. The quenching resistors 21 are each connected to an electrode E1 and the electrode E2. Each quenching resistor 21 has an end connected to an electrode E1 and an end connected to the electrode E2.

The electrode E2 is arranged in a lattice pattern to pass between the plurality of light receiving regions S included in one pixel U when viewed from the Z axis direction. The light receiving region S and the trench 13 is surrounded by the electrode E2 when viewed from the Z axis direction. The electrode E2 is electrically connected to all the light receiving regions S included in one pixel U through the electrodes E1 and the quenching resistors 21. The electrode E2 is connected to the electrode E3.

The electrode E3 extends from the electrode E2 and is electrically connected to the corresponding through-electrode 1E. All the quenching resistors 21 included in one pixel U are electrically connected in parallel to one through-electrode TE by the electrode E2 and the electrode E3.

The plurality of through-electrodes TE are located in the area where the plurality of pixels U are two-dimensionally distributed when viewed from the Z axis direction. Each through-electrode TE is disposed in an area surrounded by four adjacent pixels U except for the through-electrodes TE located at the end of the semiconductor photodetecting element 10. The through-electrodes TE are electrically connected to one of the four pixels U adjacent to each other. The through-electrodes TE and the pixels U are alternately distributed in a direction crossing the X axis and the Y axis. Each through-electrode TE is electrically connected to the plurality of avalanche photodiodes APD (the plurality of light receiving regions S) included in the corresponding pixel U through the electrodes E1, the quenching resistors 21, the electrode E2, and the electrode E3.

Figure 6:
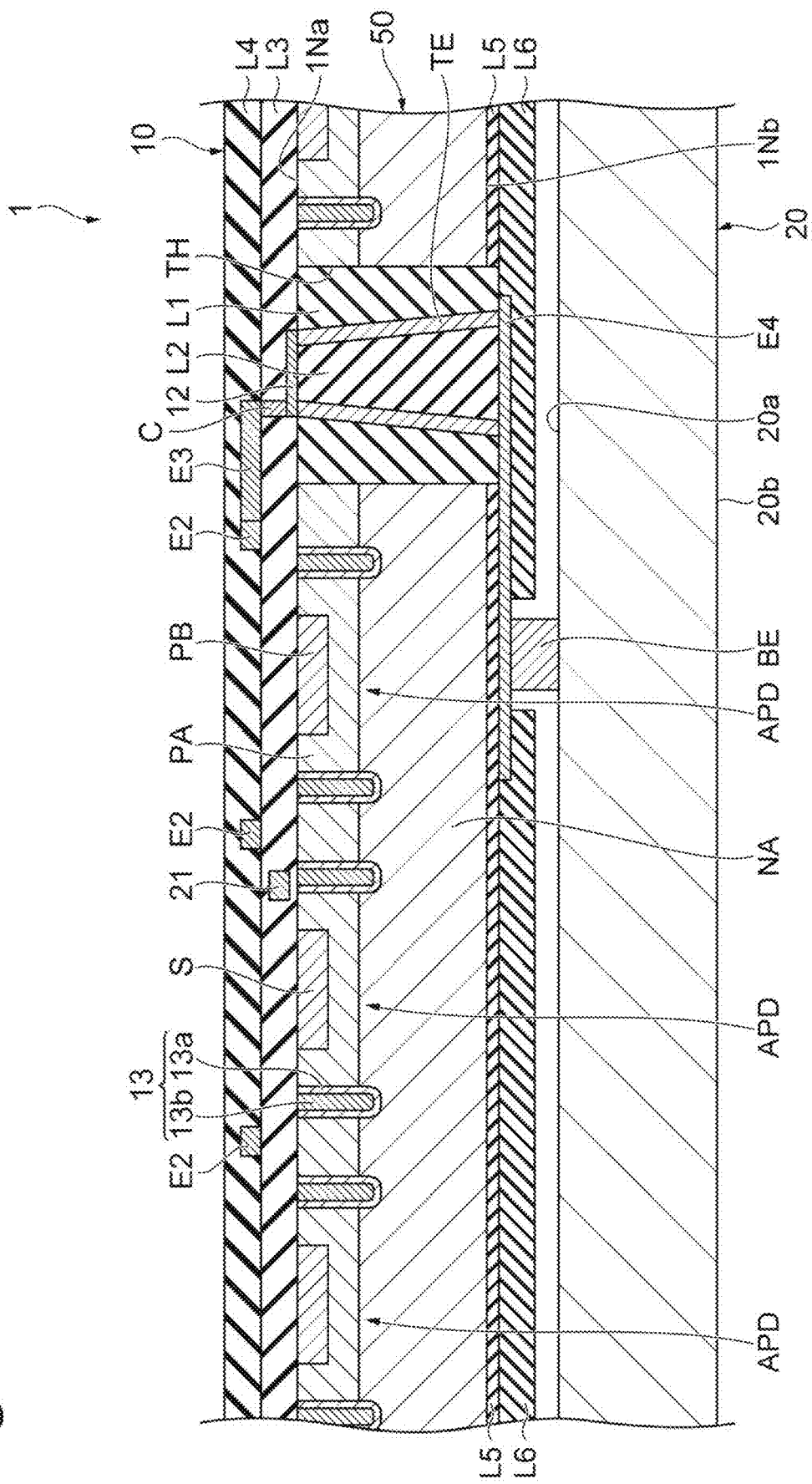
FIG. 6 is a diagram illustrating a cross-sectional configuration of the semiconductor photodetecting element.

Next, with reference to FIG. 6, the configuration of the semiconductor photodetecting element 10 according to the present embodiment will be described. FIG. 6 illustrates a sectional configuration of the semiconductor photodetecting element 10 and the mount substrate 20.

Each of the avalanche photodiodes APD includes a P-type first semiconductor region PA, an N-type second semiconductor region NA, and a P-type third semiconductor region PB. The first semiconductor region PA is located at the principal surface 1Na side of the semiconductor substrate 50. The second semiconductor region NA is located at the principal surface 1Nb side of the semiconductor substrate 50. The third semiconductor region PB is formed in the first semiconductor region PA. An impurity concentration of the third semiconductor region PB is higher than an impurity concentration of the first semiconductor region PA. The third semiconductor region PB is the light receiving region S. Each of the avalanche photodiodes APD is configured to include a P+ layer serving as the third semiconductor region PB, a P layer serving as the first semiconductor region PA, and an N+ layer serving as the second semiconductor region NA, which are arranged in this order from the principal surface 1Na.

In the semiconductor substrate 50, a trench 13 is formed to surround the third semiconductor area PB. As illustrated in FIG. 6, the trench 13 penetrates through the first semiconductor area PA in the Z axis direction and reaches the second semiconductor area NA. An insulation layer 13a and a core material 13b are arranged on the trench 13. The core material 13b is made of metal with a high melting point. The core material 13b is made of, for example, tungsten.

The semiconductor photodetecting element 10 includes an electrode pad 12 and an electrode E4 for each pixel U. The electrode pad 12 and the electrode E4 are arranged to correspond to the through-electrode TE. The electrode pad 12 is located on the principal surface 1Na, and the electrode E4 is located on the principal surface 1Nb. The electrode pad 12 is electrically connected to the electrode E3 through a connection unit C. The electrode pad 12 electrically connects the electrode E3 and the through-electrode TE.

The through-electrode TE is disposed in a through-hole TH penetrating through the semiconductor substrate 50 in the thickness direction (Z axis direction). The insulation layer L1, the through-electrode TE, and the insulation layer L2 are arranged in the through-hole TH. The insulation layer L1 is formed on the inner peripheral surface of the through-hole TH. The through-electrode TE is disposed in the through-hole TH with the insulation layer L1 interposed therebetween. The insulation layer L2 is arranged in a space formed inside of the through-electrode TE. In the present embodiment, the through-electrode TE has a tubular shape. The members disposed in the through-hole TH are arranged from the inner peripheral surface side of the through-hole TH in the following order: the insulation layer L1, the through-electrode TE, and the insulation layer L2.

An insulation layer L3 is arranged on the first semiconductor area PA, the second semiconductor area NA, the third semiconductor area PB, and the trench 13. The quenching resistor 21 and the electrode pad 12 are covered with the insulation layer L3. The electrodes E2 and E3 are arranged on the insulation layer L3 and covered with the insulation layer L4.

The electrode E4 is arranged on the principal surface 1Nb with an insulation layer L5 interposed therebetween. The electrode E4 has an end connected to the through-electrode TE and an end connected to the bump electrode BE. The electrode E4 connects the through-electrode TE and the bump electrode BE. The electrode E4 is covered with an insulation layer L6 except for the area connected to the bump electrode BE.

The electrodes E1, E2, E3, and E4, the electrode pad 12, and the through-electrode TE are made of metal. The electrodes E1, E2, E3, and E4, the electrode pad 12, and the through-electrode TE are made of, for example, aluminum (Al). When the semiconductor substrate is made of Si, copper (Cu) is used as an electrode material instead of aluminum. The electrodes E1, E2, E3, and E4, the electrode pad 12, and the through-electrode TE may be integrally formed. The electrodes E1, E2, E3, and E4, the electrode pad 12, and the through-electrode TE are formed, for example, by sputtering.

When Si is used for the material of the semiconductor substrate 50, a Group-HI element (for example, B) is used for P-type impurity and a Group-V element (for example, P or As) is used for N-type impurity. An element whose N-type and P-type, which are the conductivity-types of the semiconductor, are replaced with each other also functions as a semiconductor photodetecting element, like the semiconductor photodetecting element 10. For example, a diffusion method or an ion implantation method is used for the adding method of the impurity.

The insulating layers L1, L2, L3, L4, L5, L6, and 13a are made of, for example, $SiO_2$, SiN, or resin. For example, a thermal oxidation method, a sputtering method, a CVD method, or a resin coating method is used for forming the insulating layers L1, L2, L3, L4, L5, L6, and 13a.

The mount substrate 20 is electrically connected to the through-electrode TE with the bump electrode BE. The signal output from each avalanche photodiode APD is led to the mount substrate 20 through the electrode E1, the quenching resistor 21, the electrode E2, the electrode E3, the electrode pad 12, the through-electrode TE, the electrode E4, and the bump electrode BE.

The bump electrode BE is formed on the electrode E4 with an under bump metal (UBM), not illustrated, interposed therebetween. The UBM is made of a material with excellent electrical and physical connection with the bump electrode BE. The UBM is formed by, for example, an electroless plating method. The bump electrode BE is formed by, for example, a method of mounting a solder ball, a printing method, or an electroplating method. The bump electrode BE is made of, for example, solder or indium.

Figure 7:
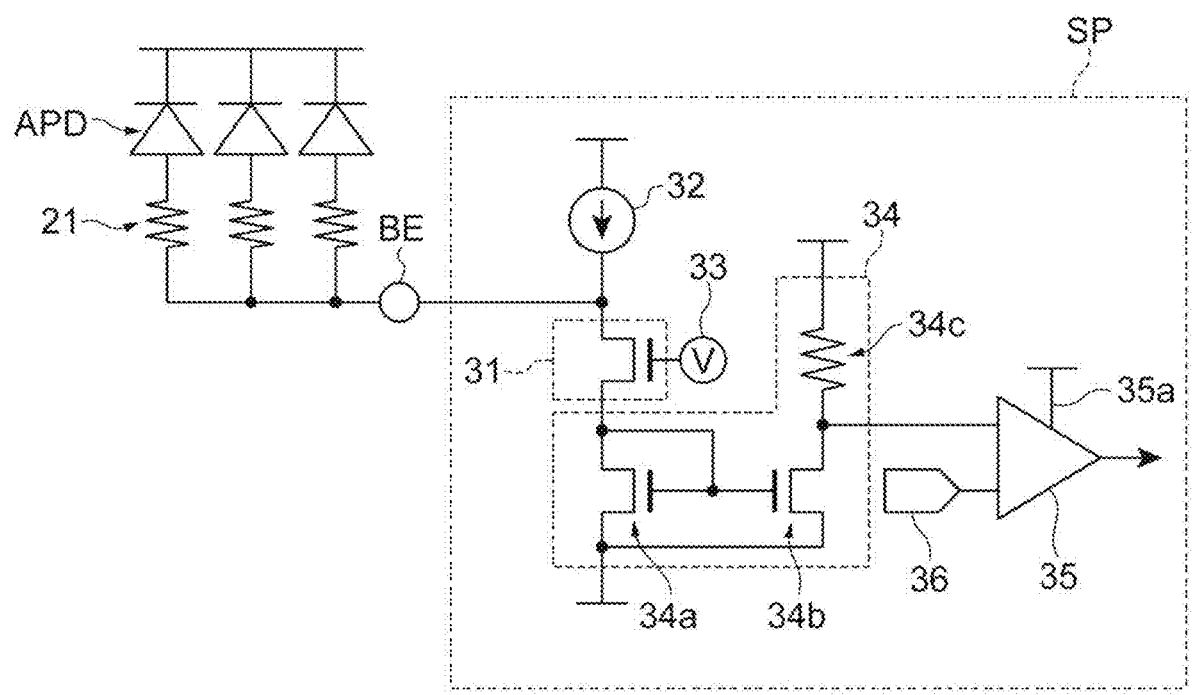
FIG. 7 is a circuit diagram illustrating a photodetecting device.

Next, the configuration of the mount substrate according to the present embodiment will be described with reference to FIG. 2 and FIG. 7. FIG. 7 illustrates the circuit configuration of photodetecting device 1.

As illustrated in FIG. 2, the mount substrate 20 includes a plurality of signal processing units SP. The plurality of signal processing units SP are two-dimensionally distributed on the principal surface 20a side of the mount substrate 20. The signal processing units SP are a front-end circuit arranged to process the signal from the corresponding avalanche photodiode APD before outputting the signal to a subsequent-stage circuit connected to the photodetecting device 1.

In the subsequent-stage circuit, the output pulse of the photodetecting device 1 may degrade due to a passive component of the subsequent-stage circuit. The signal processing unit SP is configured to transmit the pulse waveform of the output signal from each avalanche photodiode APD to the subsequent stage circuit. The signal processing unit SP has a low impedance and a high frequency response. The signal processing unit SP transmits a high-speed rise of the output signal of each avalanche photodiode APD to the subsequent stage circuit. Therefore, degradation of the output pulse of photodetecting device 1 is suppressed. The number of signal processing units SP is more than the number of light receiving regions S of each pixel U. In the present embodiment, the number of signal processing units SP is "1024", and the number of light receiving regions S of each pixel U is "12".

The signal processing unit SP includes an input end electrically connected to the bump electrode BE. Each signal processing unit SP is arranged to receive output signals from the plurality of avalanche photodiodes APD of the corresponding pixel U through the quenching resistor 21, the through-electrode TE, and the bump electrode BE. Each signal processing unit SP is arranged to process the received output signal.

Each signal processing unit SP includes a gate grounded circuit 31, a current mirror circuit 34, and a comparator 35. In the present embodiment, the gate grounded circuit 31 and the current mirror circuit 34 include an N-channel MOS FET (Metal-Oxide-Semiconductor Field Effect Transistor).

The gate grounded circuit 31 is provided between the through-electrode TE and the current mirror circuit 34 that correspond to each other. A drain of the FET of the gate grounded circuit 31 is electrically connected in series with the corresponding bump electrode BE. The gate grounded circuit 31 is arranged to receive an output signal from the plurality of avalanche photodiodes APD of the corresponding pixel U through the corresponding through-electrode TE. A constant current source 32 is electrically connected to the drain in parallel with the bump electrode BE. A voltage source 33 is electrically connected to a gate of the FET included in the gate grounded circuit 31. An input terminal of the current mirror circuit 34 is electrically connected to a source of the FET included in the gate grounded circuit 31.

The current mirror circuit 34 is electrically connected to the gate grounded circuit 31. The output signal from the gate grounded circuit 31 is input to the current mirror circuit 34. The plurality of avalanche photodiodes APD are electrically connected to the current mirror circuit 34 through the corresponding through-electrode TE. The signal corresponding to the output signals of the plurality of avalanche photodiodes APD is input into the current mirror circuit 34. The current mirror circuit 34 is arranged to output a signal corresponding to the received output signals from the plurality of avalanche photodiodes APD.

The current mirror circuit 34 includes N-channel MOS FETs 34a and 34b paired with each other. An output terminal of the gate grounded circuit 31 is electrically connected to a drain of the FET 34a. The drain and a gate of the FET 34a are short-circuited. The gate of the FET 34a is electrically connected to a gate of an FET 34b. Sources of the FET 34a and the FET 34b are grounded. A drain of the FET 34b is electrically connected to an input terminal of the comparator 35 and of a resistor 34c. The resistor 34c is electrically connected to the drain of the FET 34b in parallel with the input terminal of the comparator 35. The resistor 34c includes an end portion electrically connected to the drain of the FET 34b and a grounded end portion.

The comparator 35 includes first and second input terminals and an output terminal. The first input terminal of the comparator 35 is electrically connected to the output terminal of the current mirror circuit 34 (the drain of the FET 34b). The output signal of the current mirror circuit 34 is input to the comparator 35. The second input terminal of the comparator 35 is electrically connected to a variable voltage source 36. A voltage source is electrically connected to a power supply terminal 35a of the comparator 35. The comparator 35 is arranged to output, from the output terminal, a digital signal corresponding to the output signals from the plurality of avalanche photodiodes APD of one pixel U.

Figure 8:
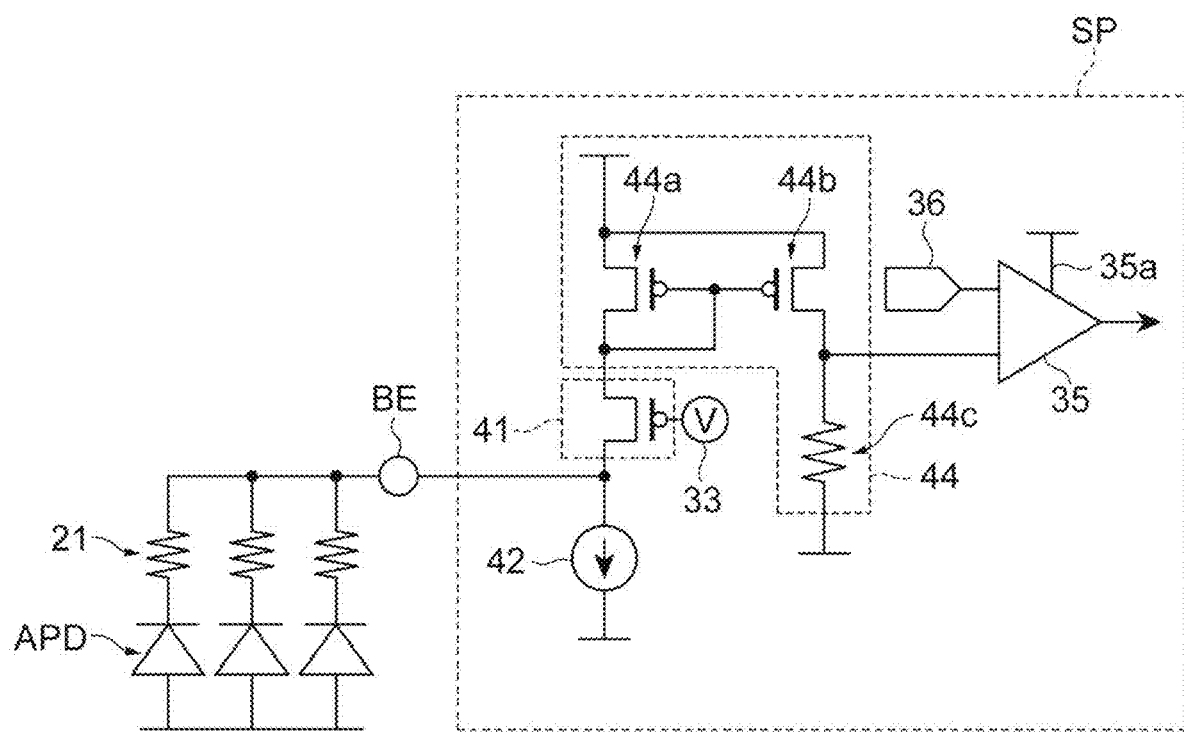
FIG. 8 is a circuit diagram illustrating a photodetecting device according to a modification of the present embodiment.

If the N type and the P type are replaced with each other in each avalanche photodiode APD, the signal processing unit SP may have the circuit configuration illustrated in FIG. 8. In which case, the polarities of the avalanche photodiode APD are inverted with respect to the through-electrode TE. The signal processing unit SP has a current mirror circuit 44 instead of the current mirror circuit 34. The current mirror circuit 44 includes P-channel MOS FETs 44a and 44b paired with each other. The signal processing unit SP includes a gate grounded circuit 41 instead of the gate grounded circuit 31. The gate grounded circuit 41 includes a P-channel MOS FET.

A drain of the FET included in the gate grounded circuit 41 is electrically connected in series with the corresponding bump electrode BE. The gate grounded circuit 41 is arranged to receive the output signals from the plural avalanche photodiodes APD of the corresponding pixel U through the corresponding through-electrode TE. The drain is electrically connected to a constant current source 42 in parallel with the bump electrode BE. The constant current source 42 and the constant current source 32 have opposite current directions. A voltage source 33 is electrically connected to a gate of the FET included in the gate grounded circuit 41. An input terminal of the current mirror circuit 44 is electrically connected to a source of the FET included in the gate grounded circuit 41.

The current mirror circuit 44 is electrically connected to the gate grounded circuit 41. The output signal from the gate grounded circuit 41 is input to the current mirror circuit 44. The plurality of avalanche photodiodes APD are electrically connected to the current mirror circuit 44 through the corresponding through-electrode 1E. The signal corresponding to the output signals from the plurality of avalanche photodiodes APD is input into the current mirror circuit 44. The current mirror circuit 44 is arranged to output a signal corresponding to the output signals from the input of the plurality of avalanche photodiodes APD.

The output terminal of the gate grounded circuit 41 is electrically connected to a drain of the FET 44a. The drain and a gate of the FET 44a are short-circuited. The gate of the FET 44a is electrically connected to a gate of the FET 44b. Sources of the FET 44a and the FET 44b are grounding. A drain of the FET 44b is electrically connected to a resistor 44c and the input terminal of the comparator 35. The resistor 44c is electrically connected to the drain of the FET 44b in parallel with the input terminal of the comparator 35. The resistor 44e includes an end portion electrically connected to the drain of the FET 44b and a grounded end portion.

The operation of photodetecting device 1 according to the present embodiment will be described with reference to FIG. 7.

In the semiconductor photodetecting element 10, each avalanche photodiode APD is arranged to operate in Geiger mode. In Geiger mode, a reverse voltage (reverse bias voltage) larger than the breakdown voltage of the avalanche photodiode APD is applied between the anode and the cathode of the avalanche photodiode APD. In the present embodiment, the anode is the first semiconductor region PA and the cathode is the second semiconductor region NA. The second semiconductor region NA is electrically connected to an electrode (not illustrated) provided on the back side of the semiconductor substrate 50. The first semiconductor region PA is electrically connected to the electrode E1 through the third semiconductor region PB. For example, a negative potential is applied to the first semiconductor region PA and a positive potential is applied to the second semiconductor region NA. The polarities of these potentials are relative to each other.

When light (photon) is incident upon the avalanche photodiode APD, photoelectric conversion is performed inside of the semiconductor substrate and photoelectrons are generated. At a region near the PN junction interface of the first semiconductor area PA, avalanche multiplication is performed, and the amplified electrons flow to the mount substrate 20 through the electrode E1, the quenching resistor 21, the electrode E2, the electrode E3, the through-electrode TE, and the bump electrode BE. When light (photon) is incident on any light receiving region S of the semiconductor photodetecting element 10, photoelectrons generated are multiplied, and a signal generated by the multiplied photoelectrons is retrieved through the bump electrode BE, and input into the corresponding signal processing unit SP. The signal processing unit SP outputs, from the output terminal, a digital pulse signal corresponding to the input signal.

As described above, in the photodetecting device 1, the semiconductor photodetecting element 10 includes the plurality of avalanche photodiodes APD arranged to operate in Geiger mode for each of the pixels U which are distributed two-dimensionally. The number of signal processing units SP is more than the number of light receiving regions S of each pixel U. In the photodetecting device 1, the internal multiplication function of each avalanche photodiode APD improves the photosensitivity at each pixel, as compared with photodetecting devices using generally-available photodiodes. Therefore, even when the light-receiving area of each pixel U is reduced in order to improve the resolution in imaging, the photodetecting device 1 detects weak light which is difficult to detect with the photodetecting devices using generally-available photodiodes. The number of avalanche photodiodes APD of each pixel U is less than the number of signal processing units SP. In the photodetecting device 1, the number of avalanche photodiodes APD electrically connected to one current mirror circuit 34, 44 is small, as compared with photodetecting devices in which the number of avalanche photodiodes APD of each pixel U is not less than the number of signal processing units SP. Therefore, in the photodetecting device 1, load of each current mirror circuit 34, 44 is reduced.

Background light is noise for weak light. The proportion of the amount of the background light received to the amount of the weak light received is small when the light-receiving area of each pixel U is small, as compared with when the light-receiving area of each pixel U is large. Therefore, the background light component per pixel U is small. When the light-receiving area of each pixel U is small, the sum of the PN junction capacitances of the avalanche photodiodes APD in each pixel U is also small. Therefore, an output signal with a steep rise is obtained from each avalanche photodiode APD.

In the photodetecting device 1, each signal processing unit SP includes current mirror circuit 34, 44. In the photodetecting device 1, each avalanche photodiode APD has an internal multiplication function. Therefore, amplification with the operational amplifier circuit is unnecessary in the signal processing unit SR The current mirror circuit 34, 44 outputs the signal corresponding to the output signals from the plurality of avalanche photodiodes APD. As compared with the operational amplifier circuit, the current mirror circuit 34, 44 has low power consumption, has a high response speed, and accurately transmits information about the input signal. The information about the input signal includes, for example, signal waveform. Therefore, the current mirror circuit 34, 44 accurately transmits the steepness of the rise of the output signal from each avalanche photodiode APD. As a result, the photodetecting device detects weak light and has high temporal resolution of the detection signal.

As described above, even when the light-receiving area of each pixel U is reduced, the photodetecting device 1 detects weak light which is difficult to detect with photodetecting devices using generally-available photodiodes. Therefore, the photodetecting device 1 can increase the number of pixels. Consequently, the resolution of photodetecting device 1 is high.

As described above, the photodetecting device 1 detects the weak light with a high degree of accuracy and with low power consumption. In the photodetecting device 1, the number of signal processing units SP including the current mirror circuit 34, 44 is larger than the number of light receiving regions S of each pixel U. The photodetecting device 1 obtains a signal amplified by an internal multiplication function of each avalanche photodiode APD, and obtains high frequency response characteristics without passing a large current in a circuit. Consequently, the photodetecting device 1 achieves both of improvement of photodetecting characteristics (photosensitivity, time resolution, spatial resolution) and a high dynamic range. The high degree of accuracy means, for example, that a weak signal with a high S/N is detected and that the time resolution is high.

In the semiconductor photodetecting element 10, the plurality of pixels U is distributed in M rows and N columns.

Figure 9:
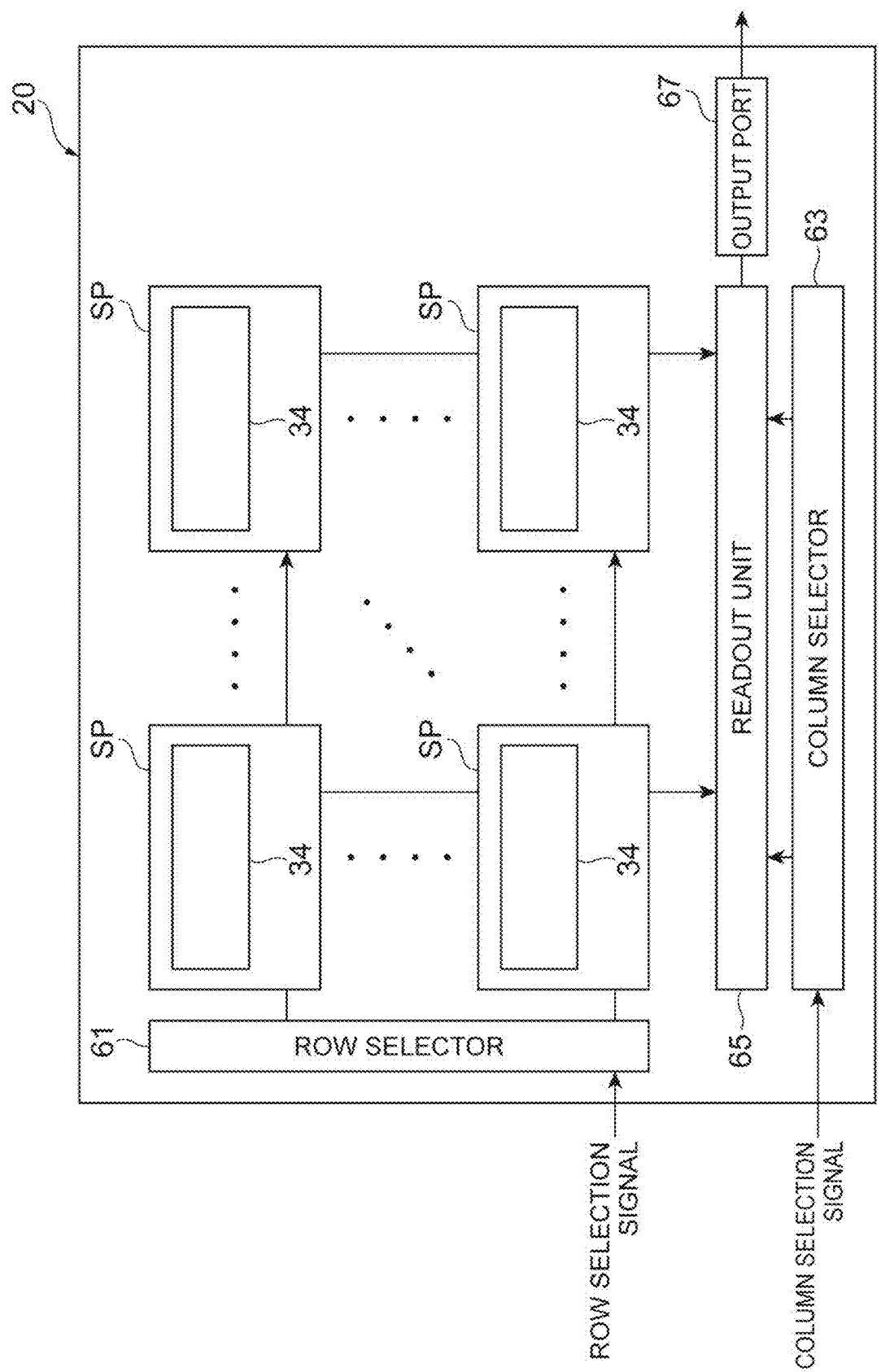
FIG. 9 is a diagram illustrating a configuration of a mount substrate.

In the mount substrate 20, the plurality of signal processing units SP is distributed in M rows and N columns as corresponding to the distribution of the pixels U. The reference character M indicates an integral equal to or more than two, and the reference character N indicates an integral equal to or more than two. As illustrated in FIG. 9, the photodetecting device 1 includes a row selector 61, a column selector 63, and a readout unit 65. The row selector 61, the column selector 63, and the readout unit 65 are provided, for example, on the mount substrate 20. The signal processing unit SP outputs a signal to a read signal line based on a control signal received from the row selector 61 though a control signal line. The signal output from the signal processing unit SP is input to the readout unit 65 through the read signal line. The row selector 61 selects a row for outputting the signal based on a row selection signal output from a controller (not shown), and outputs the control signal to the signal processing unit SP included in the selected row. The row selector 61 includes, for example, a shift resistor or a random access decoder. The readout unit 65 sequentially outputs the signals output from the signal processing unit SP based on the control signal received from the column selector 63 through the control signal line. The column selector 63 selects a column for outputting a signal based on a column selection signal output from the controller, and outputs a control signal to the readout unit 65 so as to output the signal of the selected column. The signal output from the readout unit 65 is output from the mount substrate 20 though an output port 67. The column selector 63 includes, for example, a shift resistor or a random access decoder. The controller may be provided on the mount substrate 20 or a substrate other than the mount substrate 20.

As described above, in the photodetecting device 1, the output from each pixel U is sequentially read through the corresponding signal processing unit SP and is output from the photodetecting device 1 (mount substrate 20). Therefore, the photodetecting device 1 configures an image sensor including the light receiving region S arranged to operate in Geiger mode. The photodetecting device 1 maintains the spatial resolution as an image sensor, and has the dynamic range. In contrast, a Single Photon Avalanche Diode (SPAD) does not have a dynamic range.

Each signal processing unit SP includes a gate grounded circuit 31, 41. The gate grounded circuit 31, 41 is provided between the through-electrode TE and the current mirror circuit 34, 44. The gate grounded circuit 31, 41 receives output signals from the plurality of avalanche photodiodes APD through the corresponding through-electrode TE. The output signals from the gate grounded circuit 31, 41 is input to the current mirror circuit 34, 44. The input impedance of the gate grounded circuit 31, 41 is lower than the input impedance of the read circuits other than the gate grounded circuit. Therefore, the gate grounded circuit 31, 41 accurately transmits the steepness of the rise of the output signal from each avalanche photodiode APD. As a result, each signal processing unit SP more accurately transmits the steepness of the rise of the output signal from each avalanche photodiode APD.

Each signal processing unit SP has a comparator 35. The comparator 35 receives the output signal from the current mirror circuit 34, 44. Therefore, each signal processing unit SP detects a signal having a desired pulse wave height from the signals input into the comparator 35. The comparator 35 appropriately removes noise such as, for example, dark count and the like. In the present embodiment, the variable voltage source 36 is connected to the second input terminal of the comparator 35. The variable voltage source 36 appropriately controls the voltage applied to the second input terminal. Therefore, in the signal processing unit SP, even when the pulse wave height of noise varies according to ambient light, the intended signal is detected. The intended signal has a peak value that exceeds the wave height of the noise.

In the semiconductor substrate 50, a trench 13 is formed to surround the entire circumference of each light receiving region S when viewed from the Z axis direction. Therefore, interference between adjacent avalanche photodiodes APD is prevented. In avalanche photodiodes arranged to operate in Geiger mode, for example, light emission may occur due to carrier recombination that ensues following avalanche multiplication. The avalanche photodiode APD may receive the light emitted by an adjacent avalanche photodiode APD. In photodetecting device 1, the trench 13 prevents the light emitted by the avalanche photodiode APD from being transmitted to the adjacent avalanche photodiode APD.

Although the preferred embodiments and modifications of the present invention have been described above, the present invention is not necessarily limited to the above-described embodiments and modifications, and various modifications can be made without departing from the gist thereof.

For example, the photodetecting device 1 includes the comparator 35, but the present embodiment is not limited thereto. The photodetecting device 1 may include an inverter instead of the comparator 35. In which case, the output signal from the current mirror circuit 34, 44 is input into the inverter. When the photodetecting device 1 includes the inverter, photodetecting device 1 (the signal processing unit SP) detects the desired signal from which noises less than the fixed pulse wave height has been removed.

The gate grounded circuit 31, 41 may have any one of the N-channel MOS FET and the P-channel MOS FET.

The sizes of the FETs 34*a* and 34*b* of the current mirror circuit 34 may be different from each other. The sizes of the FETs 44*a* and 44*b* of the current mirror circuit 44 may be different from each other. When the sizes of the FETs 34*a*, 34*b*, 44*a*, 44*b* paired with each other are different, the steepness of the rise of the output signal from each avalanche photodiode APD is maintained and the output can be amplified. The size of the FET means the gate length.

In the above-described embodiment, the trench 13 is formed in the semiconductor substrate 50 for each light receiving region S. A part of the trench 13 may be shared between adjacent light receiving regions S. In the semiconductor substrate 50, the trench 13 may not be formed. The quenching resistor 21, the electrode pad 12, and the electrodes E2 and E3 may be covered with a single insulation layer. The electrodes E2 may be directly connected to the electrode pad 12. The insulation layer L2 may not be arranged in the through-hole TH. In which case, the through-electrode TE may have a columnar shape or a frustum shape.

In the above-described embodiment, one layer structure of the avalanche photodiode APD is illustrated, but the layer structure of the avalanche photodiode APD is not limited thereto. For example, the first semiconductor region PA and the third semiconductor region PB may have different conductivity types. In which case, a PN junction is formed by the first semiconductor region PA and the third semiconductor region PB. For example, the second semiconductor region NA may be made of a plurality of semiconductor regions having mutually different impurity concentrations. For example, the avalanche photodiode APD may include a semiconductor region of a first conductivity type (for example, P-type), and a semiconductor region of a second conductivity type (for example N-type) that is located in the semiconductor region of the first conductivity type and that forms a pn junction with the semiconductor region of the first conductivity type. In this configuration, the semiconductor region of the second conductivity type is the light receiving region.

INDUSTRIAL APPLICABILITY

The present invention can be used for a photodetecting device to detect weak light.

REFERENCE SIGNS LIST

1 photodetecting device
10 semiconductor photodetecting element
20 mount substrate
21 quenching resistor
31, 41 gate grounded circuit
34, 44 current mirror circuit
35 comparator
50 semiconductor substrate
1Na, 1Nb, 20*a* principal surface
APD avalanche photodiode
S light receiving region
U pixel
TE through-electrode
SP signal processing unit.

The invention claimed is:

1. A photodetecting device comprising:
   a semiconductor photodetecting element that includes a semiconductor substrate having a first principal surface and a second principal surface opposing each other, and a plurality of pixels distributed two-dimensionally in the semiconductor substrate; and
   a mount substrate on which the semiconductor photodetecting element is mounted, the mount substrate including a plurality of signal processing units arranged to process output signals from the respective pixels,
   wherein, for each of the pixels, the semiconductor photodetecting element includes:
   a plurality of avalanche photodiodes each including a light receiving region provided in the first principal surface side of the semiconductor substrate, and arranged to operate in Geiger mode;
   a plurality of quenching resistors disposed on the first principal surface side of the semiconductor substrate, and each electrically connected in series with a respective avalanche photodiode; and
   a through-electrode electrically connected to the plurality of quenching resistors, and penetrating through the semiconductor substrate in a thickness direction,
   wherein the light receiving regions of the plurality of avalanche photodiodes are two-dimensionally distributed for each of the pixels,
   each of the signal processing units includes a current mirror circuit (i) electrically connected to the plurality of avalanche photodiodes via the corresponding through-electrode, and (ii) arranged to output a signal corresponding to output signals from the plurality of avalanche photodiodes,
   the plurality of signal processing units are two-dimensionally distributed in the mount substrate, and
   the number of signal processing units included in the mount substrate is more than the number of light receiving regions in each of the pixels.

2. The photodetecting device according to claim 1, wherein each of the signal processing units includes a gate grounded circuit (i) between the corresponding through-electrode and the current mirror circuit, and (ii) arranged to receive the output signals from the plurality of avalanche photodiodes via the corresponding through-electrode, and the current mirror circuits are each arranged to receive an output signal from the respective gate grounded circuits.

3. The photodetecting device according to claim 1, wherein each of the signal processing units includes a comparator arranged to receive the output signal from the current mirror circuit.

4. A photodetecting device comprising:
a semiconductor photodetecting element that includes a semiconductor substrate having a first principal surface and a second principal surface opposing each other, and a plurality of pixels distributed two-dimensionally in the semiconductor substrate; and
a mount substrate on which the semiconductor photodetecting element is mounted, the mount substrate including a plurality of signal processing units arranged to process output signals from the respective pixels,
wherein, for each of the pixels, the semiconductor photodetecting element includes:
a plurality of avalanche photodiodes each including a light receiving region provided in the first principal surface side of the semiconductor substrate, and arranged to operate in Geiger mode;
a plurality of quenching resistors disposed on the first principal surface side of the semiconductor substrate, and each electrically connected in series with a respective avalanche photodiode; and
a through-electrode electrically connected to the plurality of quenching resistors, and penetrating through the semiconductor substrate in a thickness direction,
wherein the light receiving regions of the plurality of avalanche photodiodes are two-dimensionally distributed for each of the pixels,
each of the signal processing units includes a current mirror circuit (i) electrically connected to the plurality of avalanche photodiodes via the corresponding through-electrode, and (ii) arranged to output a signal corresponding to output signals from the plurality of avalanche photodiodes,
the number of signal processing units included in the mount substrate is more than the number of light receiving regions in each of the pixels,
each of the signal processing units includes a gate grounded circuit (i) between the corresponding through-electrode and the current mirror circuit, and (ii) arranged to receive the output signals from the plurality of avalanche photodiodes via the corresponding through-electrode, and
the current mirror circuits are each arranged to receive an output signal from the respective gate grounded circuits.

* * * * *